US006650154B2

(12) United States Patent
Okuyama

(10) Patent No.: US 6,650,154 B2
(45) Date of Patent: Nov. 18, 2003

(54) STARTER CIRCUIT

(75) Inventor: Yoshiaki Okuyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/134,618

(22) Filed: Apr. 30, 2002

(65) Prior Publication Data

US 2003/0098727 A1 May 29, 2003

(30) Foreign Application Priority Data

Nov. 28, 2001 (JP) ......................................... 2001-362488

(51) Int. Cl.[7] ................................................. H03L 7/00
(52) U.S. Cl. ....................................................... 327/143
(58) Field of Search ................................. 327/142, 143, 327/198

(56) References Cited

U.S. PATENT DOCUMENTS

| 4,812,679 | A | * | 3/1989 | Mahabadi | 327/143 |
| 5,136,181 | A | * | 8/1992 | Yukawa | 327/143 |
| 5,331,209 | A | * | 7/1994 | Fujisawa et al. | 327/545 |
| 5,534,804 | A | * | 7/1996 | Woo | 327/143 |
| 6,236,250 | B1 | * | 5/2001 | Salmon et al. | 327/143 |
| 6,335,646 | B1 | * | 1/2002 | Nagatomo | 327/143 |
| 6,469,551 | B2 | * | 10/2002 | Kobayashi et al. | 327/143 |

* cited by examiner

*Primary Examiner*—Jeffrey Zweizig
(74) *Attorney, Agent, or Firm*—Arent Fox Kintner Plotkin & Kahn PLLC

(57) ABSTRACT

A voltage generating unit includes first resistors and a first transistor connected in series between first and second power supply lines. Since the gate of the first transistor is constantly supplied with a voltage higher than its drain voltage, the rise of a first voltage of a first node is gentle compared to that in the conventional art. A starter signal generating unit generates, according to the first voltage, a second voltage at a second node connecting a second resistor with a second transistor. The timing of reversing the logic level of the second voltage is delayed compared to that in the conventional art. Therefore, the time period from power-up until output of a starter signal is longer than in the conventional art. Consequently, even when the power supply voltage is low, the time period required to initialize an internal circuit is ensured, thereby initializing the internal circuit without fail.

1 Claim, 3 Drawing Sheets

STARTER CIRCUIT

BACKGROUND OF THE INVENTION

1. Field of the Invention

The present invention relates to a starter circuit that is formed in a semiconductor integrated circuit and that generates a starter signal, which initializes the circuits internal to the integrated circuit when the semiconductor integrated circuit is in power up condition.

2. Description of the Related Art

In general, a semiconductor integrated circuit incorporates a starter circuit that generates a starter signal. Prevention of malfunction of the semiconductor integrated circuit is realized by initializing the internal circuit of the semiconductor integrated circuit, utilizing a time period from power-up until the generation of a starter signal. This kind of starter circuit utilizes the threshold voltages of transistors to detect that the power supply voltage rises to a predetermined value and change the logic level of the starter signal. The internal circuit having latches or the like is initialized before the generation of the starter signal and start its normal operation after the generation of the starter signal.

FIG. 1 shows a starter circuit disclosed in Japanese Unexamined Patent Application Publication No. 2000-165220. This starter circuit includes a voltage generating unit 10, a starter signal generating unit 12, and a waveform shaping circuit 14 that outputs a starter signal STT.

The voltage generating unit 10 has resistors R1 and R2 and an nMOS transistor M1 connected in series between a power supply line VDD and a ground line VSS. The gate and drain of the nMOS transistor M1 are connected to each other. The voltage at a connection node ND1 between the resistors R1 and R2 in the voltage generating unit 10 rises with a rise of the power supply voltage VDD until it exceeds the threshold voltage of the nMOS transistor M1. After the voltage at the node ND1 exceeds the threshold voltage of the nMOS transistor M1, it rises as a voltage obtained by adding the threshold voltage to the voltage obtained by dividing the voltage difference between the power supply voltage VDD and the threshold voltage.

The starter signal generating unit 12 has a resistor R3 and an nMOS transistor M2 connected in series between the power supply line VDD and the ground line VSS. The gate of the nMOS transistor M2 is connected to the node ND1. The voltage at a connection node ND2 between the resistor R3 and the nMOS transistor M2 rises with the rising power supply voltage VDD until the nMOS transistor M2 is turned on. After the nMOS transistor M2 is turned on, the voltage at the node ND2 becomes equal to the ground voltage VSS.

The waveform shaping unit 14, which has three inverters in a cascade connection, generates the starter signal STT in accordance with the voltage generated at the node ND2.

In the starter circuit as described above, when the threshold voltage of the nMOS transistor M1 is high, the voltage as divided at the node ND1 is high. Conversely, when the threshold voltage of the nMOS transistor M1 is low, the voltage as divided at the node ND1 is low. In a typical semiconductor integrated circuit, the threshold voltages of adjacent transistors exhibit the same value. For this reason, when the threshold voltage of the nMOS transistor M1 is high, that of the nMOS transistor M2 is also high. Thus, when the threshold voltage of the nMOS transistor M2 is high, the voltage at the node ND1 is high, and when the threshold voltage of the nMOS transistor M2 is low, the voltage at the node ND1 is low. In this way, varying the gate-to source voltage of the nMOS transistor M2 in accordance with the threshold voltage thereof allows the starter signal STT to be generated nearly at a predetermined timing (a predetermined power supply voltage VDD), hardly being affected by the threshold voltage of the nMOS transistor M2.

Recently, semiconductor integrated circuits have been designed to consume a lower operating voltage and hence receive a lower power supply voltage VDD from the exterior of the semiconductor integrated circuits. The threshold voltages of the transistors are hardly dependent on the power supply voltage VDD. For this reason, as the power supply voltage VDD becomes lower, the ratio of the threshold voltages of the transistors to the power supply voltage VDD becomes larger, with the result that the deviation of the timing of generation of the starter signal STT caused by a variation in the threshold voltages becomes relatively large. That is, it has become difficult to generate the starter signal STT at a predetermined timing.

As the power supply voltage VDD becomes lower, the time period in which the power supply line of the internal circuit reaches the power supply voltage VDD at power-up becomes shorter. It is, therefore, necessary to shorten the time period in which the starter signal STT is generated after power-up (the time period required to initialize the internal circuit). On the other hand, if the time period required to initialize the internal circuit is not adequately obtained, there is a fear that the internal circuit is not initialized, resulting in a malfunction of the semiconductor integrated circuit. In order to ensure that the internal circuit is initialized, the time period for initializing the internal circuit must be elongated as much as possible.

SUMMARY OF THE INVENTION

It is an object of the present invention to ensure that, even when the power supply voltage is low, the starter signal is generated and the internal circuit of the semiconductor integrated circuit is initialized.

According to one of the aspects of the starter circuit of the present invention, a voltage generating unit has a plurality of first resistors and a first transistor connected in series between a first power supply line and a second power supply line. The voltage generating unit generates a first voltage at a first node where resistive division is made by the first resistors. A gate of the first transistor is always supplied with a voltage higher than a drain voltage thereof. That is, the source-to-gate voltage of the first transistor is higher than in the conventional art, and the on-resistance of the first transistor is lower. For this reason, the first voltage that is generated at the first node after the power supply voltage exceeds the threshold voltage of the first transistor at power-up and the first transistor is turned on is lower than in the conventional art. That is, the first voltage gently rises, as compared with that in the conventional art.

A starter signal generating unit has a second resistor and a second transistor connected in series between the first and second power supply lines. The gate of the second transistor is connected to the first node. The starter signal generating unit generates, in accordance with the first voltage of the first node, a second voltage at a second node connecting the second resistor with the second transistor. Specifically, when the first voltage exceeds the threshold voltage of the second transistor, the logic level of the second voltage is reversed. Since the first voltage gently rises, the timing of reversing the logic level of the second voltage is delayed compared to that in the conventional art.

A waveform shaping unit shapes a waveform of the voltage of the second node and outputs a shaped waveform as a starter signal that initializes an internal circuit of an integrated circuit. Since the timing of reversing the logic level of the second voltage is delayed compared to that in the conventional art, the time period from the power-up until the output of the starter signal is longer than in the conventional art. Consequently, even when the power supply voltage is low, the time period that is long enough to initialize the internal circuit of the semiconductor integrated circuit can be obtained, thereby initializing the internal circuit without fail.

According to another aspect of the starter circuit of the present invention, the first transistor is connected its gate to any one of the nodes where resistive divisions are made, respectively, by the first resistors. Consequently, the gate voltage of the first transistor can be maintained constantly higher than the drain voltage thereof, without forming any special circuit.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENT

An embodiment of the present invention will be described below with reference to the drawings. In the embodiment, elements corresponding to those of the foregoing conventional art are identified by the same reference designations, and their detailed descriptions are omitted.

Figure 2:
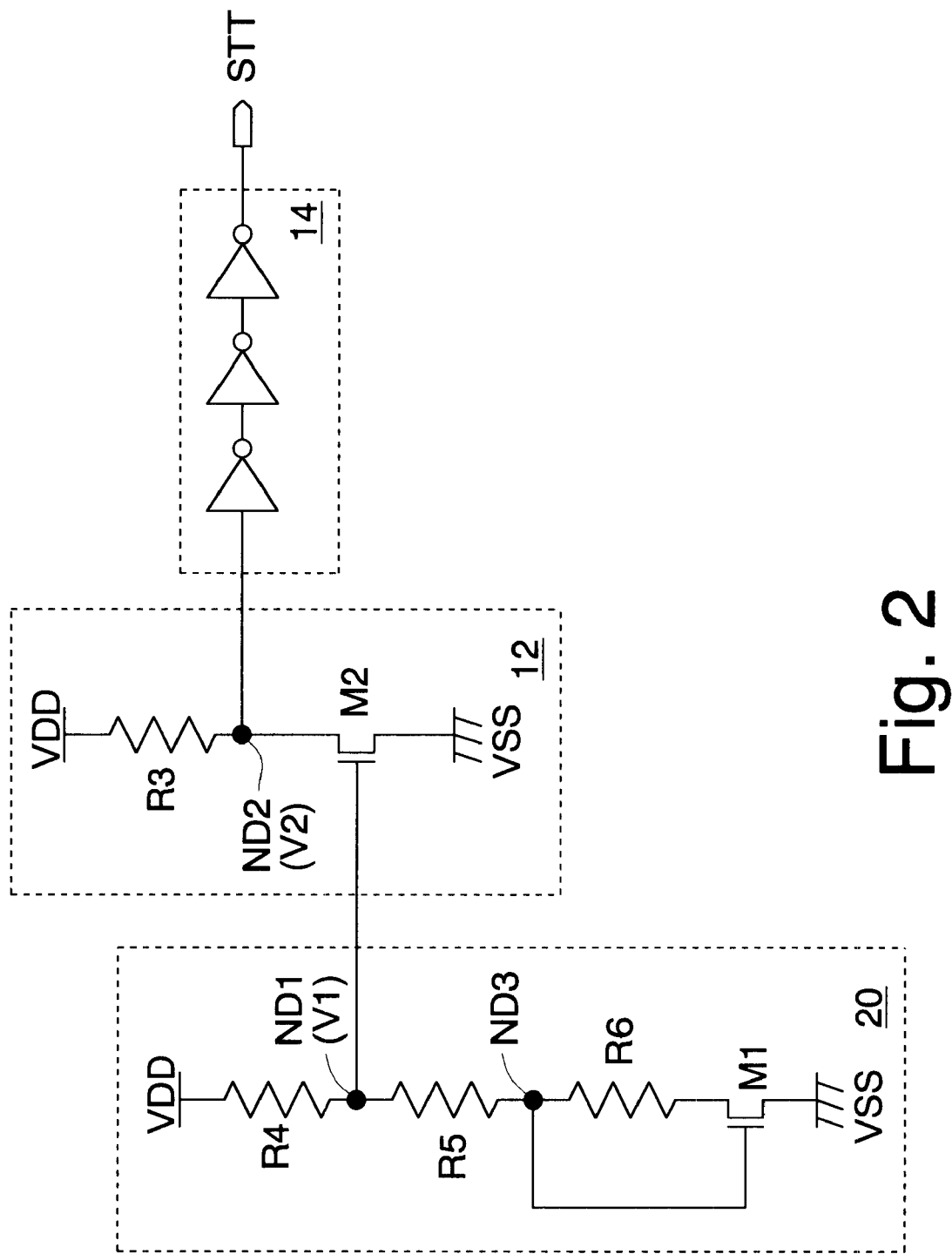
FIG. 2 is a circuit diagram showing a starter circuit according to the present invention.

FIG. 2 shows an embodiment of a starter circuit according to the present invention. This starter circuit is formed in a semiconductor integrated circuit, which is formed on a silicon substrate by use of a CMOS process. The starter circuit includes a voltage generating unit 20, a starter signal generating unit 12, and a waveform shaping unit 14 that outputs a starter signal STT.

The voltage generating unit 20 has resistors R4, R5, and R6 (the first resistors) connected in series between a power supply line VDD (the first power supply line) and a ground line VSS (the second power supply line), and also has an nMOS transistor M1 (the first transistor). The gate of the nMOS transistor M1 is connected to a connection node ND3 between the resistors R5 and R6. Thus, the gate voltage of the nMOS transistor M1 is always higher than the drain voltage thereof. The voltage generating unit 20 generates a first voltage V1 at a connection node ND1 (the first node) between the resistors R4 and R5.

Figure 1:
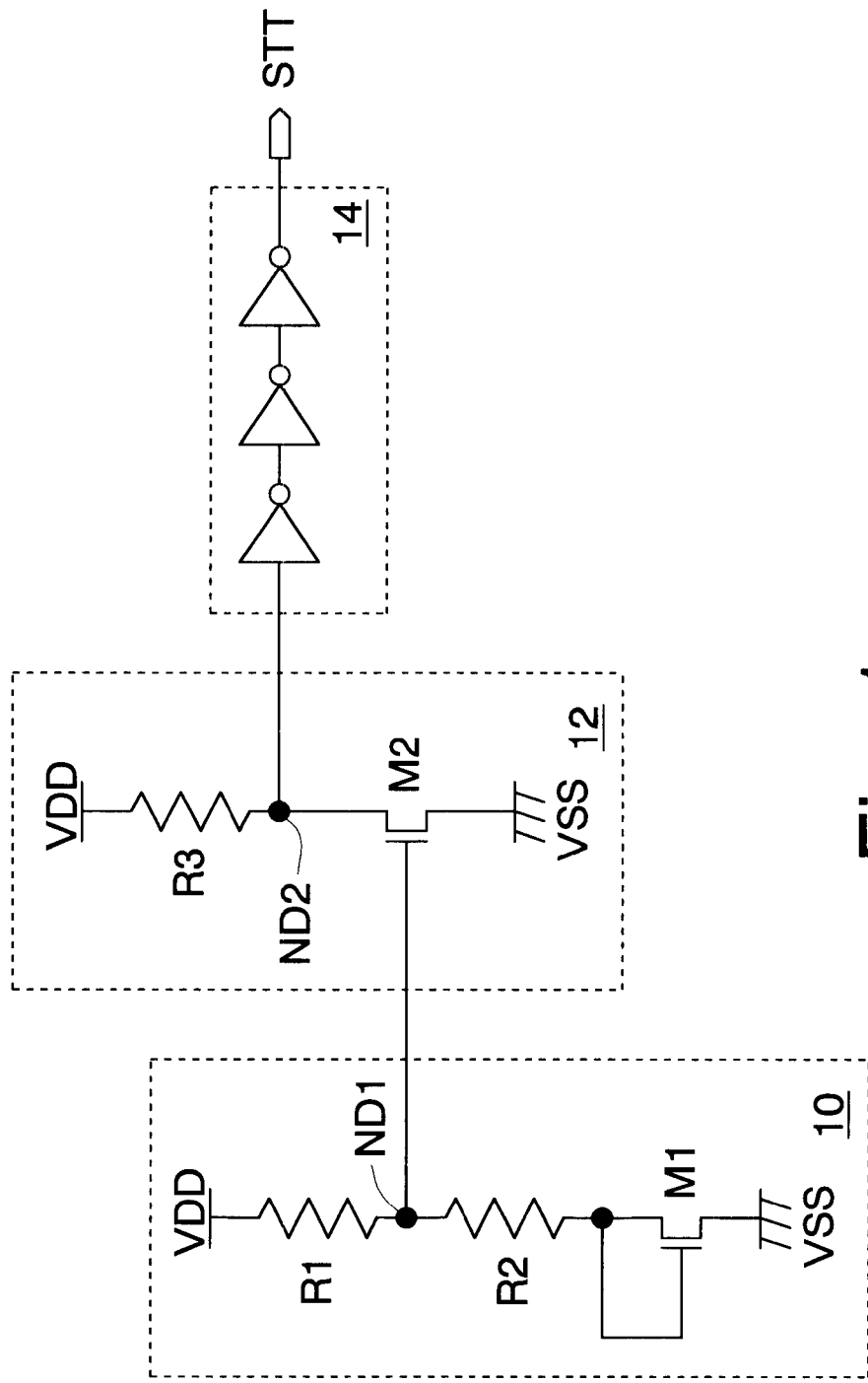
FIG. 1 is a circuit diagram showing a conventional starter circuit.

The starter signal generating unit 12 and waveform shaping unit 14 have the same structures as the corresponding units of FIG. 1. That is, the gate of an nMOS transistor M2 (the second transistor) of the starter signal generating unit 12 is connected to the node ND1. The starter signal generating unit 12 generates a second voltage V2 at a connection node ND2 (the second node) between a resistor R3 (the second resistor) and the nMOS transistor M2. The waveform shaping unit 14 shapes the waveform of the second voltage V2 and outputs the shaped waveform as the starter signal STT.

Figure 3:
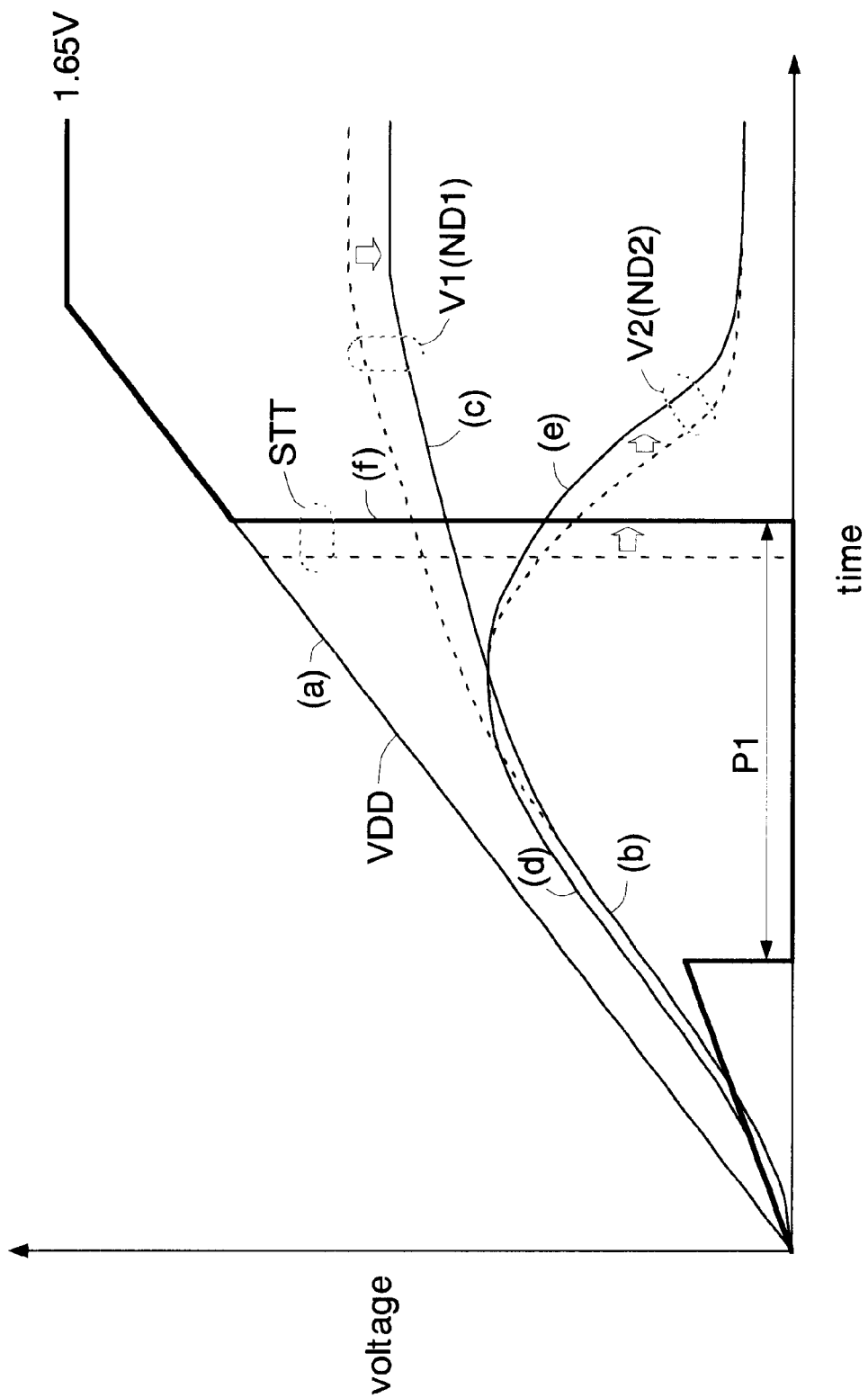
FIG. 3 is a waveform diagram showing the operation of the starter circuit of FIG. 2.

FIG. 3 shows the operation of the starter circuit as described above.

The power supply voltage VDD gradually rises to a predetermined voltage (e.g., 1.65 V) after power-up of the semiconductor integrated circuit (FIG. 3(a)). That is, the operating voltage of the semiconductor integrated circuit is 1.65 V. The voltage at the node ND1 rises with the rising power supply voltage VDD until the gate-to-source voltage of the nMOS transistor M1 exceeds the threshold voltage thereof (FIG. 3(b)). After the gate-to-source voltage of the nMOS transistor M1 exceeds the threshold voltage thereof, the voltage at the node ND1 rises as a voltage obtained by adding the threshold voltage to the voltage obtained by dividing the voltage difference between the power supply voltage VDD and the threshold voltage (FIG. 3(c)). At this moment, since the gate of the nMOS transistor M1 is constantly supplied with a voltage higher than the drain voltage thereof, the on-resistance of the nMOS transistor M1 is lower than in the conventional art. Accordingly, the voltage at the node ND1 gently rises, as compared with the conventional voltage shown by a dashed line.

The voltage at the node ND2 also rises with the rising power supply voltage VDD until the gate-to-source voltage of the nMOS transistor M2 exceeds the threshold voltage thereof (FIG. 3(d)). After the gate-to-source voltage of the nMOS transistor M2 exceeds the threshold voltage thereof, the voltage at the node ND2 drops (FIG. 3(e)). At this moment, since the voltage of the node ND1 applied to the gate of the nMOS transistor M2 is always lower than in the conventional art, the timing of turning on the nMOS transistor M2 is delayed compared to that in the conventional art. Accordingly, the voltage at the node ND2 drops later than the conventional voltage shown by a dashed line.

Since the change-to-the-low-voltage at the node ND2 is delayed, the timing of generating the starter signal STT (the change to the high level) is delayed compared to that in the conventional art shown by a dashed line. Thus, a low-level time period P1 of the starter signal STT is longer than in the conventional art. This longer time period P1 is utilized to initialize the internal circuit of the semiconductor integrated circuit.

In the present embodiment described above, the gate of the nMOS transistor M1 is constantly supplied with the voltage higher than the drain voltage thereof. This can provide a gentle rise of the first voltage V1 to be generated at the node ND1 after the nMOS transistor M1 is turned on at power-up, as compared with that in the conventional art. Thus, the timing of dropping of the second voltage V2 can be delayed compared to that in the conventional art, so that the low-level time period P1 continuing until the generation of the starter signal STT can be made longer than in the conventional art. Consequently, even when the power supply voltage is low, the time period that is long enough to initialize the internal circuit can be obtained, thereby initializing the internal circuit of the semiconductor integrated circuit without fail.

The gate of the nMOS transistor M1 is connected to the node. ND3 at which a resistive division is made by the resistors R5 and R6. This can maintain the gate voltage of the nMOS transistor M1 higher than the drain voltage thereof without forming any special circuit.

The invention is not limited to the above embodiment and various modifications may be made without departing from the spirit and scope of the invention. Any improvement may be made in part or all of the components.

What is claimed is:

1. A starter circuit comprising:

a voltage generating unit, including a first resistor, a second resistor, a third resistor, and a first transistor, connected in series between a first power supply line and a second power supply line, said first transistor being connected at its gate to a connection node of said second and third resistors, and said voltage generating unit generating a first voltage at a first node where resistive division is made by said first and second resistors;

a starter signal generating unit including a fourth resistor and a second transistor having its gate connected to said first node, connected in series between said first power supply line and said second power supply line, which generates a second voltage at a second node connecting said fourth resistor with said second transistor; and a waveform shaping unit for shaping a waveform of the voltage of said second node and outputting the shape waveform as a starter signal that initializes an internal circuit of an integrated circuit.

* * * * *